US005528053A

United States Patent [19]

Schwalke

[11] Patent Number: 5,528,053

[45] Date of Patent: Jun. 18, 1996

[54] THIN-FILM TRANSISTOR AND METHOD FOR THE MANUFACTURE THEREOF

[75] Inventor: Udo Schwalke, Heldenstein, Germany

[73] Assignee: Siemens Aktiengesellschaft, Munich, Germany

[21] Appl. No.: 279,111

[22] Filed: Jul. 22, 1994

[30] Foreign Application Priority Data

Aug. 12, 1993 [DE] Germany .......................... 43 27 132.4

[51] Int. Cl.[6] .......................... H01L 29/76; H01L 21/302

[52] U.S. Cl. ............................ 257/66; 257/302; 257/401; 437/225

[58] Field of Search ............................... 257/66, 74, 302, 257/329, 401, 412, 623; 437/225

[56] References Cited

U.S. PATENT DOCUMENTS

| | | | |
|---|---|---|---|
| 4,630,088 | 12/1986 | Ogura et al. | 257/302 |
| 5,064,775 | 11/1991 | Chang | 437/40 |
| 5,136,350 | 8/1992 | Itoh | 257/401 |

OTHER PUBLICATIONS

"Impact of Surrounding Gate Transistor (SGT) for Ultra–High Density LSI's", by Hiroshi Takato, et al, et al., IEEE Transactions on Electron Devices, vol. 38, No. 3, Mar. 1991, pp. 573–578.

"Mechanism of Plasma Hydrogenation of Polysilicon Thin Film Transistors", by Uday Mitra et al, J. Electrochem. Soc. vol. 138, No. 11, Nov. 1991, pp. 3420–3424.

"The Effect of Interface States on Amorphous–Silicon Transistors", by Nobuki Ibaraki, et al., IEEE Transactions on Electron Devices, vol. 36, No. 12, Dec. 1989, pp. 2971–2972.

"Subscriber Line Interface Circuit LSI Fabricated Using High–Voltage CMOS/SIMOX Technology", Electronics Letters, 8th Dec. 1983, vol. No. 25/26, pp. 1095–1097.

"A Half Micron SRAM Cell Using a Double–Gated Self–Aligned Polysilicon PMOS Thin Film Transistor (TFT) Load", by A. O. Adan, etal. Integrated Cir.Group.Corp. 1990 Sym on VLSI Tech. pp. 19–20.

*Primary Examiner*—Mark V. Prenty

*Attorney, Agent, or Firm*—Hill, Steadman & Simpson

[57] ABSTRACT

A thin-film transistor has a doped polysilicon layer arranged at the surface of a substrate and has a polysilicon structure arranged on the doped polysilicon layer that is doped with the opposite conductivity type and that is limited by a sidewall is provided. The polysilicon structure has a source/drain region that is doped with the conductivity type of the doped polysilicon layer. A gate dielectric and a gate electrode thereon are arranged on the sidewall of the polysilicon structure between source/drain region and polysilicon layer, which likewise acts as source/drain region.

5 Claims, 5 Drawing Sheets

5
31
7
7
6
6
2
1
21

8
7
31
51
7
8
6
5
5
6
2
1
21

10
9
11
31
51
11
6
6
8
7
5
5
7
8
2
1
21

13
12
6
7
11
14
11
6
7
8
5
5
8
31
2
21
1

THIN-FILM TRANSISTOR AND METHOD FOR THE MANUFACTURE THEREOF

BACKGROUND OF THE INVENTION

Thin-film transistors, which are also referred to as TFT, are realized in polycrystalline or amorphous semiconductor layers. These semiconductor layers are produced, for example, by deposition of polysilicon, amorphous silicon, Si—C or diamond and, if necessary, by subsequent recrystallization. The semiconductor layer is thereby applied on a substrate.

Thin-film transistors are realized in planar form (see, for example U.S. Pat. No. 5,064,775). In order to avoid a short between a source region and a drain region via the substrate, the substrate must therefore be insulating at least at the boundary surface to the polycrystalline semiconductor layer. Insulating substrates of glass, oxides or nitrides are preferably employed for thin-film transistors, When a planar thin-film transistor is to be fabricated on an electrically-conductive foundation, then an electrically-insulating intermediate layer must be deposited between the foundation and the polycrystalline semiconductor layer. Charges captured at the boundary surface between the polycrystalline semiconductor layer and the insulating intermediate layer or interconnects located in the foundation lead to electrical fields that have a disadvantageous effects on the charge transport in the thin-film transistor.

U. Mitra et al, J. Electrochem. Soc. 138, page 3420, (1991), discloses that disturbing boundary surface charges in oxides be reduced by tempering in forming gas.

N. Ibaraki et al, ED36, page 2971, 1989, has proposed that the insulating intermediate layer be fashioned of a different material, for example nitride, that has more beneficial boundary surface properties. The plurality of disturbing boundary surface charges is to be reduced in this way by selecting the material of the intermediate layer.

Electrical fields elicited by an interconnect under the thin-film transistor, these electrical fields deteriorating the functioning of the thin-film transistor, can be shielded by inserting an additional shielding layer (see Nakashima et al, Electronics Lett. 19, page 1095 (1983)).

Polycrystalline semiconductor layers have grain boundaries. In the thin-film transistor, these grain boundaries lead to disturbances of the charge transport in the MOS channel. It is known (see H. N. Chern et al., EDL 14, page 115 (1993)) to reduce the disturbances of the charge transport at the grain boundaries by passivation of imperfections. To that end, a polycrystalline silicon layer is tempered in a hydrogen atmosphere or in a plasma that contains hydrogen and/or oxygen.

The properties of the thin-film transistors are deteriorated due to the capture of charge carriers and scatter of charge carriers at grain boundaries. By comparison to MOS transistors integrated in monocrystalline silicon, thin-film transistors currently exhibit a current yield that is reduced by a factor of 20–100. The low current yield of thin-film transistors must be compensated by larger geometrical dimensions. This leads to an increased use of area.

A. O. Adam et al., VLSI Symp. page 19 (1990), has proposed that the current yield of a thin-film transistor be increased by attaching an additional control electrode to the underside of the thin-film transistor. However, this increases the complexity of the component.

SUMMARY OF THE INVENTION

It is an object of the present invention to provide a thin-film transistor having a reduced area requirement and that can be applied to arbitrary substrate surfaces. In particular, the thin-film transistor should exhibit a current yield that is improved in comparison to known thin-film transistors. The invention is also provides a manufacturing method for such a thin-film transistor.

The thin-film transistor of the invention has a reduced space requirement, since the source/channel/drain sequence is not arranged parallel to the surface of the substrate but along the sidewall of the polysilicon structure. Since only the polysilicon layer, which forms the one source/drain region of the thin-film transistor, is in communication with the surface of the substrate, the surface of the substrate can be either electrically conductive or insulating. The substrate in the thin-film transistor of the invention can, therefore, be selected in conformity with the demands of the planned use of the transistor. In particular, it is possible that the surface of the substrate is electrically conductive. As a result thereof, the thin-film transistor of the invention is also suitable for integration in a three-dimensional circuit arrangement. In this case, the surface of the substrate can have contacts or terminals of components that are to be connected to the source/drain region of the thin-film transistor formed by the polysilicon layer.

The polysilicon structure preferably has a sidewall that proceeds essentially perpendicularly relative to the surface of the substrate. In this case, the charge carrier transport in the channel of the thin-film transistor occurs essentially perpendicularly relative to the surface of the substrate. Since polysilicon recrystallizes with preference in a direction that is vertical relative to the surface of the substrate, oblong crystallites are formed that are aligned essentially perpendicularly relative to the surface of the substrate, In the thin-film transistor of the invention, thus, the charge carrier transport proceeds largely in the grains. The interaction of the charge carriers with imperfections at the grain boundaries is therefore reduced from the very outset, the current yield being increased as a result thereof.

When the polysilicon structure has a region doped with a first conductivity type at the boundary surface to the polysilicon layer, then the one source/drain region extends over the polysilicon layer and the doped region into the polysilicon structure. The overlap of the gate electrode over the channel region of the thin-film transistor is improved given this structure. This leads to a reduction of the series resistance in the transistor.

According to an especially advantageous embodiment of the invention, the gate dielectric and the gate electrode annularly surround the polysilicon structure. In this thin-film transistor, the charge carrier transport proceeds in the inside of the polysilicon structure and is not exposed to any external electrical fields whatsoever. Since the gate electrode completely surrounds the thin-film transistor, the gate area is optimally utilized and the surface requirement of the thin-film transistor is reduced even more.

In many circuit applications, the source region together with the substrate of a MOS transistor is applied to the same potential. To that end, it lies within the scope of the invention to annularly orient the source/drain region provided in the polysilicon structure, so that it adjoins the sidewall of the polysilicon structure over the entire circumference. The polysilicon structure has a terminal region doped with the second conductivity type and an increased dopant concentration that adjoins the surface of the polysilicon structure facing toward the polysilicon layer. It lies within the scope of the invention to electrically connect the terminal region and the source/drain region to one another via a metal contact and to apply them to the same potential.

The objects of the present invention are inventively achieved in a thin-film transistor having a substrate with a surface, a polysilicon layer having a surface and a boundary surface, polysilicon layer being oriented at the surface of the substrate, the polysilicon layer also being doped with a first conductivity type. The apparatus further has a polysilicon structure with which is doped with a second conductivity type opposite the first conductivity type and the polysilicon structure is oriented at the surface of the polysilicon layer limited by a sidewall. The polysilicon structure also has a source/drain region doped with the first conductivity type adjoining at least a part of the sidewall such that the source/drain region lies opposite the boundary surface to the polysilicon layer. The transistor also has a gate dielectric oriented at least at the sidewall between the source/drain region and the boundary surface to likewise act as the source/drain region and a gate electrode oriented on the surface of the gate dielectric in a region of the sidewall, the gate electrode being insulated from the polysilicon layer and the polysilicon structure. Also, the objects of the invention are preventively achieved in a method for manufacturing a thin-film transistor. The method has the steps of applying a first polysilicon layer that is doped with a first conductivity type onto the surface of a substrate, applying a second polysilicon layer that is doped with a second conductivity type opposite the first conductivity type onto the first polysilicon layer, producing a polysilicon structure limited by a sidewall by structuring at least the second polysilicon layer, producing a gate dielectric that at least partially covers the sidewall of the polysilicon structure, the gate dielectric having a surface, producing a gate electrode oriented on the surface of the gate dielectric in a region of the sidewall so that the gate electrode is insulated from the first polysilicon layer and the polysilicon structure, and producing a source/drain region that is doped with the first conductivity type such that the source/drain region is opposite the boundary surface to the first polysilicon layer in the polysilicon structure, the source/drain region adjoining at least a part of the sidewall.

The invention shall be set forth in greater detail below with reference to an exemplary embodiment and to the Figures.

DETAILED DESCRIPTION OF THE PREFERRED EMBODIMENTS

Figure 1:
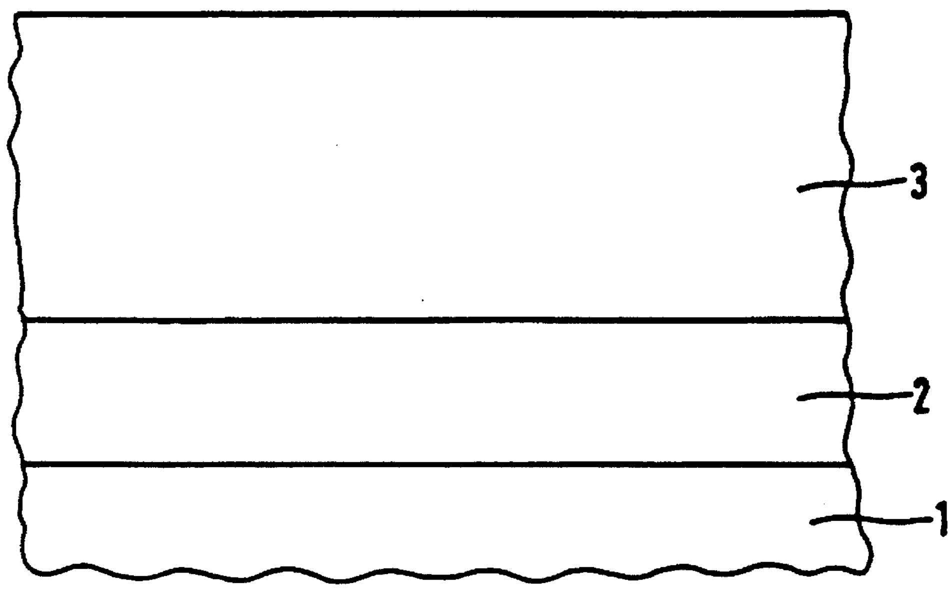
FIG. 1 shows a substrate with a first polysilicon layer and a second polysilicon layer of the present invention.

An amorphous silicon layer $n^+$-doped in situ is deposited onto a substrate 1 and an amorphous silicon layer p-doped in situ is deposited on said $n^+$-doped, amorphous silicon layer. The amorphous silicon is recrystallized in a tempering step at, for example, 600° C. in a nitrogen atmosphere. A first polysilicon layer 2 that is $n^+$-doped with a dopant concentration of, for example, $1\times10^{20}$ P/cm$^3$ and that has a layer thickness between 50 and 1000 nm thereby forms. A second polysilicon layer 3 that is p-doped with a dopant concentration of, for example $5\times10^{16}$ B/cm$^3$ and that has a layer thickness between 50 and 1000 nm also forms (see FIG. 1).

Figure 2:
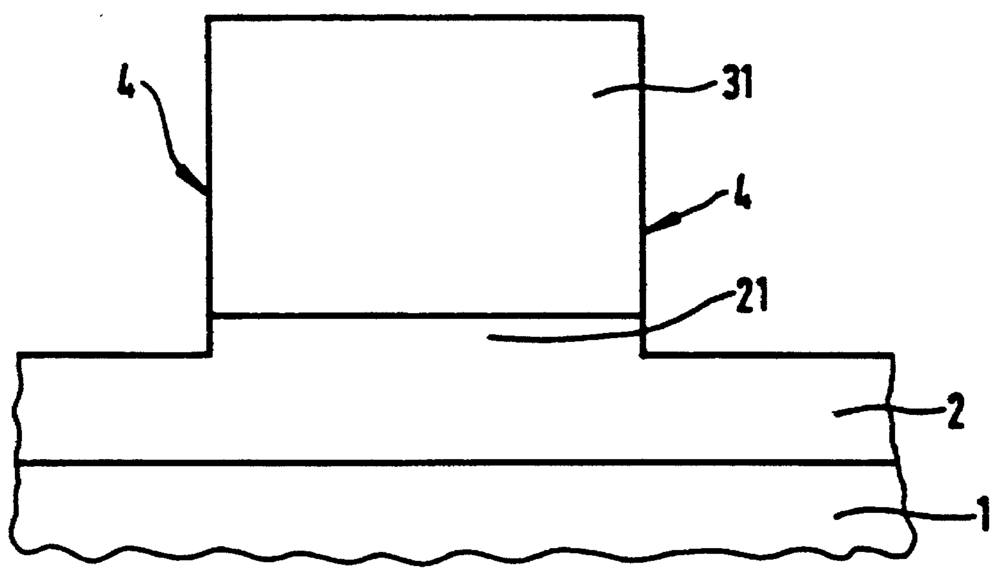
FIG. 2 shows the substrate after an etching step for producing a polysilicon structure of the present invention.

By using a photoresist mask, a polysilicon structure 31 (see FIG. 2) is produced in a dry etching process by structuring the second polysilicon layer 3 and the first polysilicon layer 2. The etching is designed such that the first polysilicon layer 2 is only slightly incipiently etched. As a result thereof, the polysilicon structure 31 has an $n^+$-doped region 21 at the boundary surface to the first polysilicon layer 2. The first polysilicon layer 2 and the $n^+$-doped region 21 form a drain region for the thin-film transistor. The p-doped part of the polysilicon structure 31 corresponds to what is referred to as the body polysilicon in a conventional, planar thin-film transistor.

For example, an $HBr/Cl_2$ chemistry is suitable as dry etching process. Parallel to the surface of the substrate 1, the polysilicon structure 31 has a cross section that, for example, is rectangular. The polysilicon structure 31 is limited along the sides of the rectangle by an annularly interconnected sidewall 4. The sidewall 4 proceeds essentially perpendicularly relative to the surface of the substrate 1.

Figure 3:
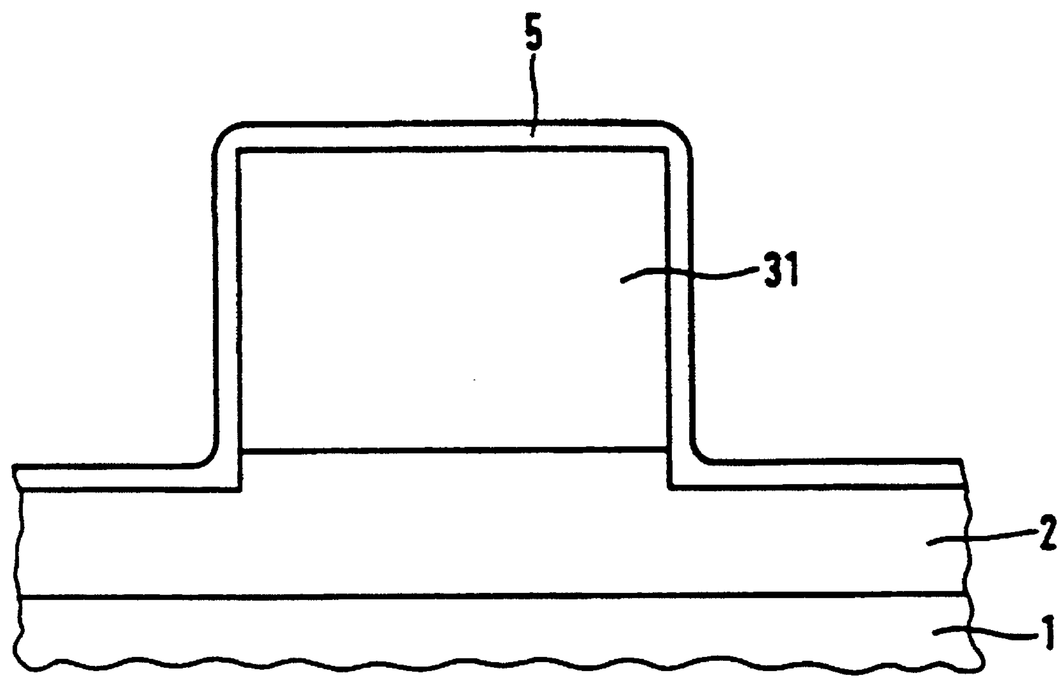
FIG. 3 shows the substrate after deposition of a dielectric layer of the present invention.

Subsequently, a dielectric layer 5 is deposited surface-wide with essentially conformal edge coverage (see FIG. 3). The dielectric layer 5 acts as a gate dielectric in the thin-film transistor. The dielectric layer 5 is produced, for example, by CVD deposition of $SiO_2$ or $Si_3N_4$ or by thermal oxidation and has a thickness between 5 and 100 nm.

Figure 4:
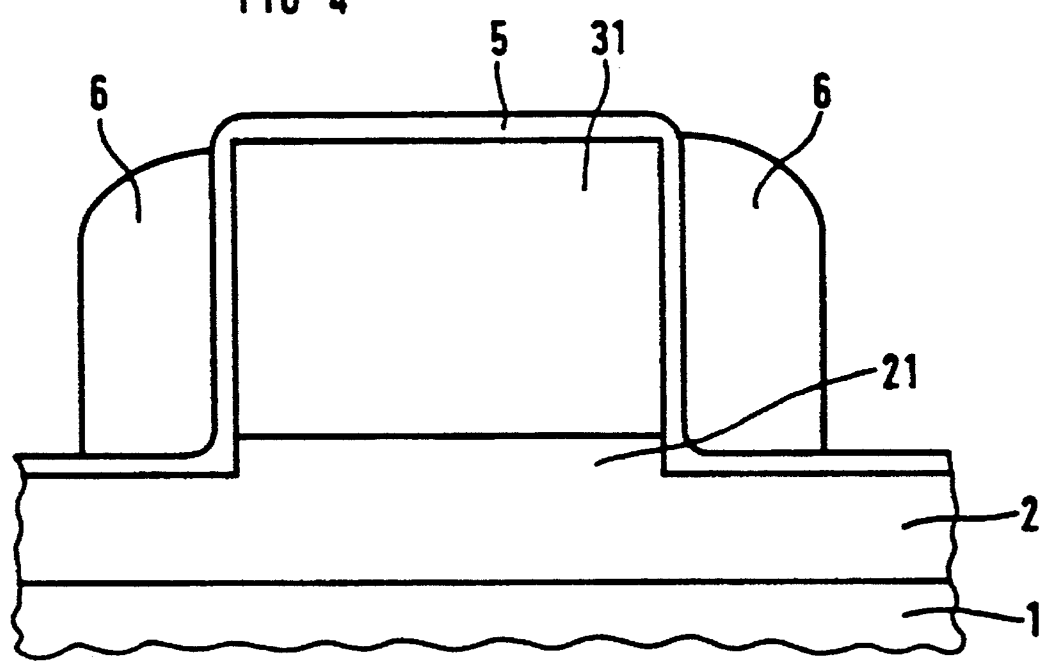
FIG. 4 shows the substrate after manufacture of an annular gate electrode of the present invention.

Subsequently, an amorphous or polycrystalline silicon layer that, for example, is $n^+$-doped in situ is deposited surface-wide with essentially conformal edge coverage. The deposited silicon is etched back by anisotropic dry etching, so that a spacer 6 forms along the sidewalls 4 of the polysilicon layer 3 covered with the dielectric layer 5. The spacer 6 annularly surrounds the polysilicon structure 31. The spacer 6 forms a gate electrode for the thin-film transistor to be manufactured (see FIG. 4). The gate electrode can be formed of $n^+$- or $p^+$-doped silicon. The dopant concentration preferably is $10^{20}$ atoms/cm$^3$.

Figure 5:
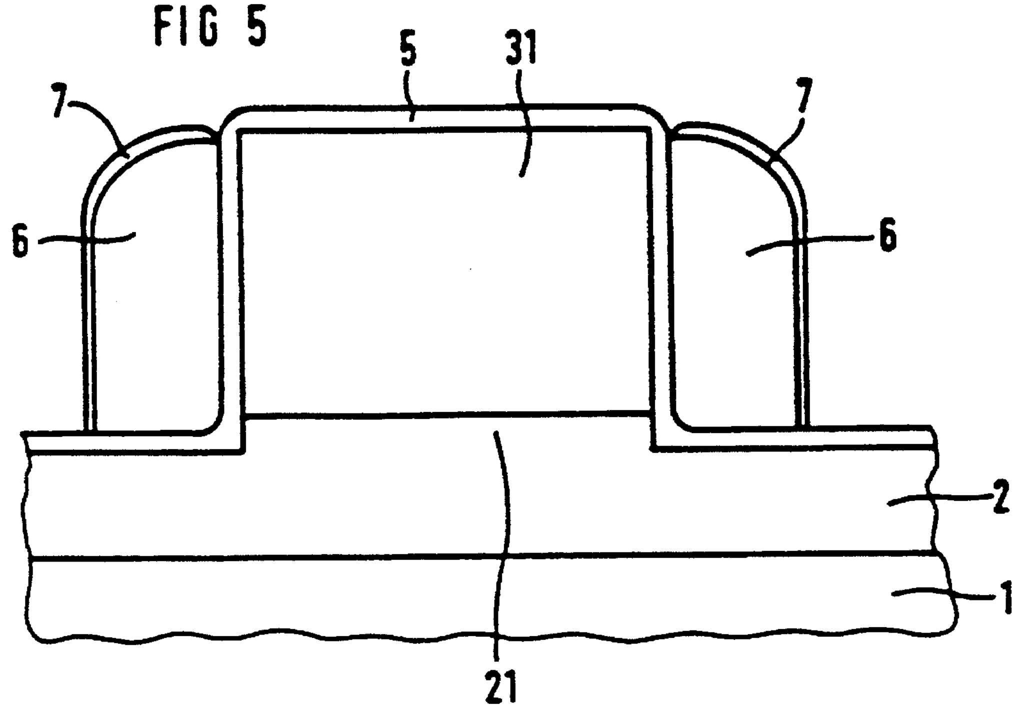
FIG. 5 shows the substrate after passivation of the gate electrode of the present invention.

Subsequently, the surface of the spacer 6 has a thin, passivating layer 7. The thin, passivating layer 7 is produced, for example, by oxidation of the surface of the spacer 6 or by CVD deposition of $SiO_2$ or $Si_3N_4$ with a thickness of, for example, 5 to 20 nm (see FIG. 5).

Figure 6:
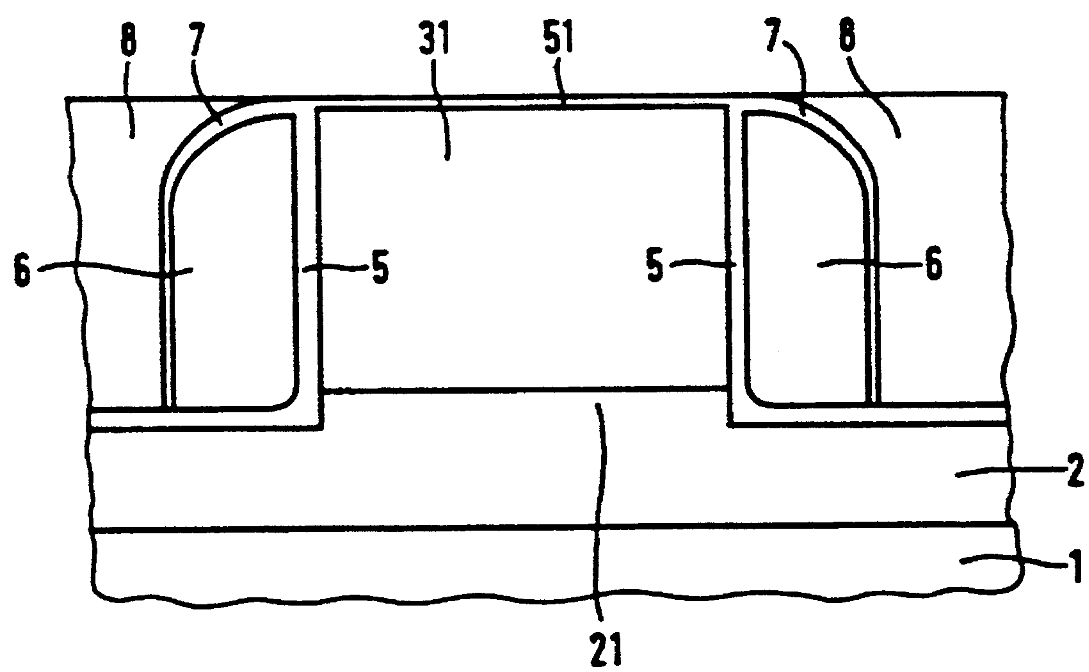
FIG. 6 shows the substrate after surface-wide application and planarization of an insulating layer of the present invention.

Subsequently, a planarized, insulating layer 8 (see FIG. 6) is applied surface-wide to the structure. To that end, for example a CVD plasma oxide having adequate thickness is deposited surface-wide and is subsequently planarized, for example with lacquer and re-etching or via an electrochemical polishing process. In the planarization, a part 51 of the dielectric layer 5 arranged on the surface of the polysilicon structure 31 parallel to the substrate surface is thinned to such an extent that it is suitable as dispersion oxide in a subsequent implantation.

Figure 7:
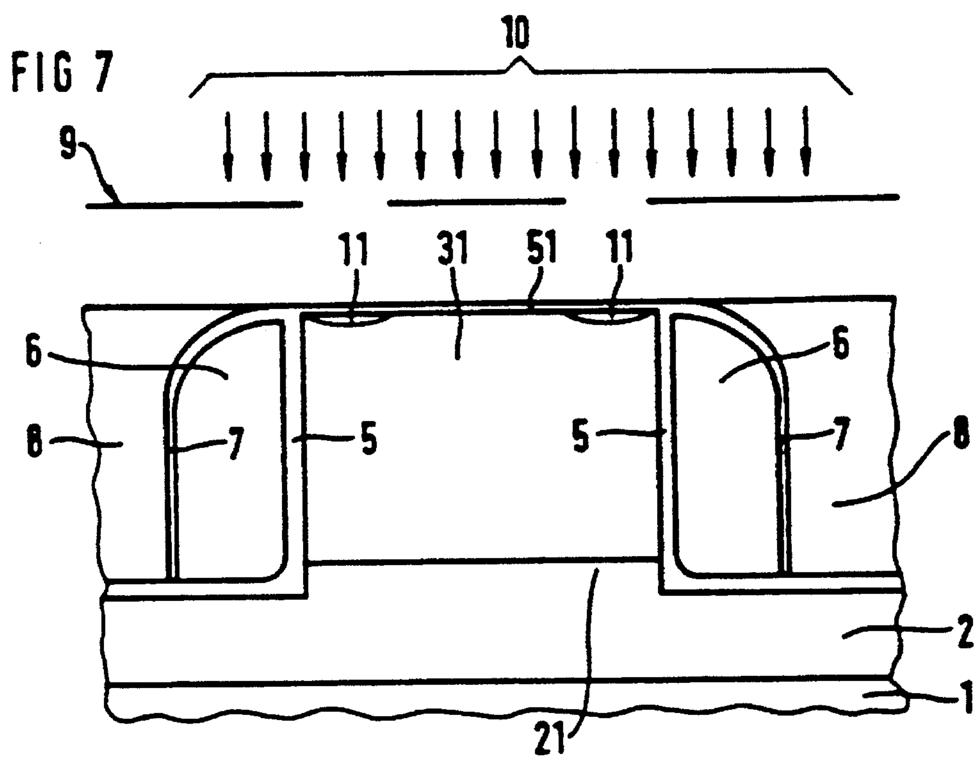
FIG. 7 shows the substrate given an implantation for generating an annular source/drain region along the sidewall of the polysilicon structure of the present invention.

By using a photoresist mask 9, a first ion implantation—indicated by the arrows 10—is subsequently implemented with arsenic or phosphorus. An annular source region 11 arranged along the sidewall of the polysilicon structure 31 is thereby implanted (see FIG. 7).

Figure 8:
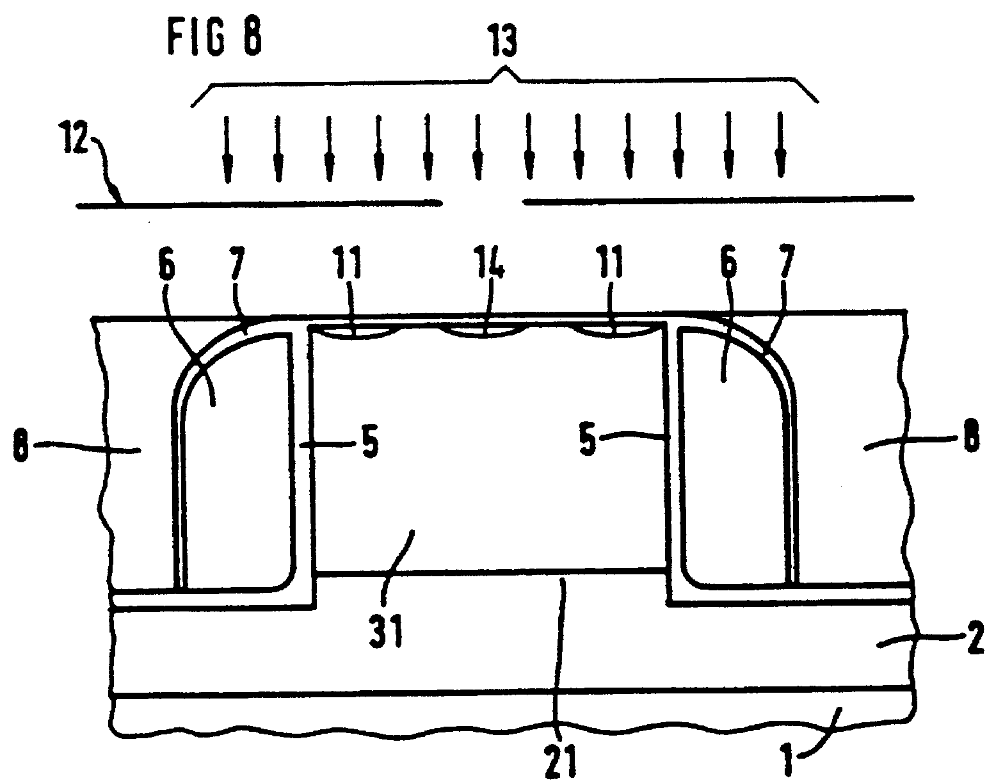
FIG. 8 shows the substrate in a further masked implantation for producing a terminal region for the polysilicon structure of the present invention.

A further photoresist mask 12 is produced after removal of the photoresist mask 9. A second ion implantation, indicated with arrows 13, is implemented with boron or $BF_2$ ions by using a further photoresist mask 12 (see FIG. 8). A $p^+$-doped terminal region 14 is thereby produced at the surface of the polysilicon structure 31 within the annular source region 11.

Figure 9:
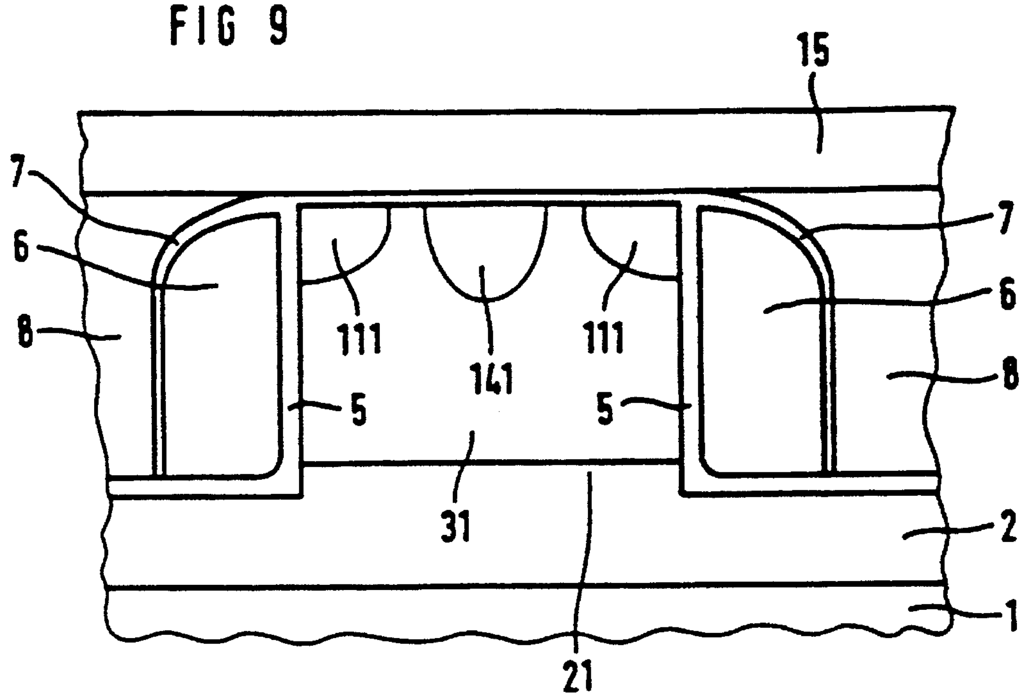
FIG. 9 shows the substrate after surface-wide application of a passivation layer of the present invention.

A tempering step for activating the dopant is subsequently implemented. The activated source region 111 and the activated terminal region 141 thereby arise (see FIG. 9).

A passivation layer 15 is applied surface-wide. For example, the passivation layer 15 is applied as an $SiO_2/Si_3N_4$ layer or as an $SiO_2$/borophosphorous silicate glass.

Figure 10:
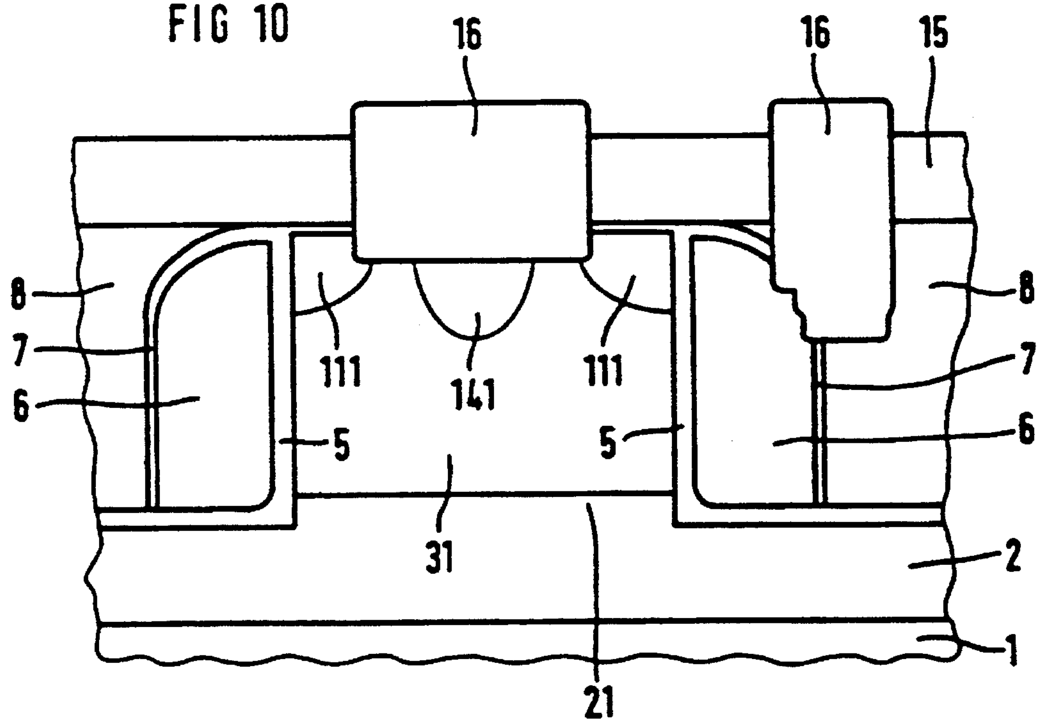
FIG. 10 shows the substrate after opening via holes and producing metallizations in the via holes of the present invention.

Via holes to the terminal region 141 and to the source region 111 as well as to the spacer 6 acting as gate electrode are etched in the passivation layer 15. The via holes are filled with metallizations 16 (see FIG. 10). The terminal region 141 and the source region 111 are thereby shorted via a common contact.

The substrate 1 can be either insulator material, such as, for example, glass, as well as conductive material or semiconductor material. It is advantageous for three-dimensional circuit arrangements to provide contacts to circuit elements realized in the substrate 1 at the surface of the substrate 1. These circuit elements are electrically connected to the drain region of the thin-film transistor. As a result of the application of the first polysilicon layer 2, such contacts are connected self-aligned to the drain region of the thin-film transistor.

The invention has been set forth with reference to the example of an n-channel transistor. The invention can be analogously transferred to a p-channel transistor.

Although other modifications and changes may be suggested by those skilled in the art, it is the intention of the inventor to embody within the patent warranted hereon all changes and modifications as reasonably and properly come within the scope of his contribution to the art.

I claim:

1. A method for manufacturing a thin-film transistor, the method comprising the steps of:

applying a first polysilicon layer that is doped with a first conductivity type onto the surface of a substrate;

applying a second polysilicon layer that is doped with a second conductivity type opposite said first conductivity type onto said first polysilicon layer;

producing polysilicon structure limited by a sidewall by structuring at least said second polysilicon layer;

producing a gate dielectric that at least partially covers said sidewall of said polysilicon structure by applying a dielectric layer having essentially conformal edge coverage surface-wide to said polysilicon structure, said gate dielectric having a surface;

producing a gate electrode oriented on said surface of said gate dielectric in a region of said sidewall so that said gate electrode is insulated from said first polysilicon layer and from said polysilicon structure; and producing a source/drain region that is doped with said first conductivity type such that said source/drain region is opposite said surface to said first polysilicon layer in said polysilicon structure, said source/drain region adjoining at least a part of said sidewall;

annularly producing said source/drain region to adjoin said sidewall of said polysilicon structure over its entire circumference;

forming a terminal region doped with said second conductivity type and an increased dopant concentration in said polysilicon structure, said terminal region adjoining said polysilicon structure at the surface facing away from said first polysilicon layer;

applying an insulating layer surface-wide and planarizing said insulating layer after said step of producing a gate electrode;

thinning a region of said dielectric layer oriented on said surface of said polysilicon structure that is parallel to said substrate surface such that after said step of said planarizing said insulating layer, said region provides a dispersion oxide for a subsequent ion implantation;

producing said source/drain region by said ion implantation using a mask;

producing said terminal region by a further ion implantation using a further mask;

applying a passivation layer surface-wide to said polysilicon structure opening via holes in said passivation layer to expose said gate electrode, said source/drain region and said terminal region; and providing said via holes with a metallization.

2. A method according to claim 1, wherein said step of producing a polysilicon structure is further defined by producing said polysilicon structure with a sidewall essentially perpendicular to said surface of said substrate.

3. A method according to claim 1, wherein said step of producing a polysilicon structure is further defined by producing said polysilicon structure by using a dry etching process, and whereby the duration of the etching is designed such that said first polysilicon layer is incipiently etched, so that said polysilicon structure has a region doped with said first conductivity type at said surface to said first polysilicon layer.

4. A method according to claim 1, wherein said step of producing a gate electrode is further defined by forming said gate electrode of doped polysilicon.

5. A method according to claim 1, wherein said step of producing a gate electrode is further defined by producing said gate electrode by surface-wide deposition of a conductive layer having essentially conformal edge coverage and by anisotropic etching said conductive layer to form a spacer remaining at said sidewall of said polysilicon structure.

* * * * *